(12) United States Patent
Yug et al.

(10) Patent No.: US 11,508,947 B2
(45) Date of Patent: Nov. 22, 2022

(54) METHOD OF MANUFACTURING ELECTRONIC APPARATUS

(71) Applicant: Samsung Display Co., Ltd., Yongin-si (KR)

(72) Inventors: Geunwoo Yug, Seoul (KR); Mu-Hyun Kim, Seoul (KR); Bon-Joo Koo, Cheonan-si (KR); Taehyun Jung, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 174 days.

(21) Appl. No.: 16/992,026

(22) Filed: Aug. 12, 2020

(65) Prior Publication Data

US 2021/0098750 A1   Apr. 1, 2021

(30) Foreign Application Priority Data

Sep. 30, 2019   (KR) .................... 10-2019-0120717
May 27, 2020   (KR) .................... 10-2020-0063592

(51) Int. Cl.
*H01L 51/56* (2006.01)
*H01L 27/32* (2006.01)
(Continued)

(52) U.S. Cl.
CPC .......... *H01L 51/56* (2013.01); *B23K 26/0624* (2015.10); *B23K 26/08* (2013.01);
(Continued)

(58) Field of Classification Search
None
See application file for complete search history.

(56) References Cited

U.S. PATENT DOCUMENTS 6,781,092 B2 * 8/2004 De Steur ............ H05K 3/0032
219/121.79
2003/0201260 A1 * 10/2003 Steur ................... H05K 3/0032
219/121.71
(Continued)

FOREIGN PATENT DOCUMENTS

KR    10-0984726    10/2010
KR    10-1922922    11/2018
KR    2019-0027003    3/2019

*Primary Examiner* — J. E. Schoenholtz
*Assistant Examiner* — Joe Schoenholtz
(74) *Attorney, Agent, or Firm* — H.C. Park & Associates, PLC

(57) ABSTRACT

A method of manufacturing an electronic apparatus includes: providing a work substrate including a preliminary set module including an active area including a hole formation area; and a protective film covering at least one of an upper surface and a rear surface of the preliminary set module; radiating the laser beam to the work substrate from a first start point toward a moving path removing at least a portion of the work substrate to form a first start cutting line in the hole formation area, the moving path of the laser beam defined as a boundary between the hole formation area and the active area; radiating the laser beam along the moving path; and removing the hole formation area from the preliminary set module to form a module hole, wherein the first start cutting line forms a predetermined angle with respect to a tangential line of the moving path.

20 Claims, 15 Drawing Sheets

(51) Int. Cl.
*H01L 51/00* (2006.01)
*B23K 26/70* (2014.01)
*B23K 26/38* (2014.01)
*B23K 26/0622* (2014.01)
*B23K 26/08* (2014.01)
*B23K 101/36* (2006.01)

(52) U.S. Cl.
CPC .......... *B23K 26/0876* (2013.01); *B23K 26/38* (2013.01); *B23K 26/706* (2015.10); *H01L 27/3234* (2013.01); *H01L 27/3244* (2013.01); *H01L 51/0097* (2013.01); *B23K 2101/36* (2018.08); *H01L 2251/5338* (2013.01); *H01L 2251/566* (2013.01)

(56) References Cited

U.S. PATENT DOCUMENTS

| | | | | |
|---|---|---|---|---|
| 2016/0304386 | A1* | 10/2016 | Dong | B23K 26/0622 |
| 2018/0315357 | A1* | 11/2018 | Nam | H01L 27/3223 |
| 2019/0348633 | A1 | 11/2019 | Lee et al. | |
| 2019/0363266 | A1* | 11/2019 | Tanaka | H01L 27/322 |

* cited by examiner

METHOD OF MANUFACTURING ELECTRONIC APPARATUS

CROSS REFERENCE TO RELATED APPLICATION

This application claims priority from and the benefit of Korean Patent Applications No. 10-2019-0120717, filed on Sep. 30, 2019 and No. 10-2020-0063592, filed on May 27, 2020, which is hereby incorporated by reference for all purposes as if fully set forth herein.

BACKGROUND

Field

Exemplary embodiments of the invention generally relate to a method of manufacturing an electronic apparatus and, more specifically, to a method of manufacturing an electronic apparatus including an electronic module.

Discussion of the Background

An electronic apparatus operates in response to electrical signals applied thereto. The electronic apparatus includes a display unit that displays an image or a sensing unit that senses an external input. An organic light emitting display panel included in the display unit has advantageous properties, such as low power consumption, high brightness, and fast response speed.

Meanwhile, the electronic apparatus includes an electronic module that receives an external signal or outputs an output signal to the outside. The electronic module is accommodated in an external case, together with a display panel to form the electronic apparatus.

The above information disclosed in this Background section is only for understanding of the background of the inventive concepts, and, therefore, it may contain information that does not constitute prior art.

SUMMARY

Methods according to exemplary embodiments of the invention are capable of providing a method of manufacturing an electronic apparatus, which is capable of forming an electronic module having improved durability.

Additional features of the inventive concepts will be set forth in the description which follows, and in part will be apparent from the description, or may be learned by practice of the inventive concepts.

According to one or more exemplary embodiments of the invention, a method of manufacturing an electronic apparatus includes: providing a work substrate, the work substrate including: a preliminary set module including: an active area, the active area including a hole formation area; and a non-active area defined adjacent to the active area; and a protective film covering at least one of an upper surface and a rear surface of the preliminary set module; radiating a laser beam to a first start point defined inside the hole formation area; radiating the laser beam to the work substrate from the first start point toward a moving path to form a first start cutting line in the hole formation area by removing at least a portion of the work substrate between the first start point and the moving path, the moving path of the laser beam defined as a boundary between the hole formation area and the active area; radiating the laser beam along the moving path; and removing the hole formation area from the preliminary set module to form a set module in which a module hole may be defined, wherein the first start cutting line forms a predetermined angle with respect to a tangential line of a point at which the first start cutting line meets the moving path.

The method may further include: radiating the laser beam from the moving path toward a first end point defined inside the hole formation area.

The method may further include: forming a first end cutting line from the moving path to the first end point inside the hole formation area by removing at least a portion of the work substrate using the laser beam, wherein one end of the first start cutting line and one end of the first end cutting line may overlap with each other on the moving path.

The other end of the first start cutting line and the other end of the first end cutting line may be spaced apart from each other inside the hole formation area.

The first start cutting line may have a length equal to or greater than about 500 μm and equal to or smaller than about 750 μm.

The laser beam may rotate along the moving path multiple times in the radiating of the laser beam along the moving path.

The angle may be equal to or greater than about 10 degrees and equal to or smaller than about 90 degrees.

The method may further include: radiating the laser beam to a second start point defined inside the hole formation area and spaced apart from the first start point; radiating the laser beam to a direction toward the moving path from the second start point; radiating the laser beam along the moving path; and radiating the laser beam to a direction toward a second end point defined inside the hole formation area from the moving path.

The method may further include removing the protective film from the set module.

The laser beam may include at least one of a picosecond laser beam and a femtosecond laser beam.

According to one or more exemplary embodiments of the invention, a method of manufacturing an electronic apparatus includes: providing a work substrate including: a preliminary set module including: an active area, the active area including a hole formation area; and a non-active area defined adjacent to the active area; and a protective film covering at least one of an upper surface and a rear surface of the preliminary set module; radiating a laser beam to a first start point defined inside the hole formation area; forming a first start cutting line inside the hole formation area, including: removing at least a portion of the work substrate from the first start point to a moving path by radiating the laser beam to a direction toward the moving path from the first start point, the moving path of the laser beam defined as a boundary between the hole formation area and the active area; radiating the laser beam along the moving path; forming a first end cutting line inside the hole formation area, including: removing at least a portion of the work substrate from the moving path to a first end point defined inside the hole formation area by radiating the laser beam to a direction from the moving path toward the first end point; and removing the hole formation area from the preliminary set module to form a set module in which a module hole may be defined, wherein one end of the first start cutting line and one end of the first end cutting line may overlap with each other on the moving path.

The first start cutting line may form a predetermined angle with respect to a tangential line of a point at which the first start cutting line meets the moving path.

The angle may be equal to or greater than about 10 degrees and equal to or smaller than about 90 degrees.

The other end of the first start cutting line and the other end of the first end cutting line may be spaced apart from each other inside the hole formation area.

At least one of the first start cutting line and the first end cutting line may be a curved line.

The first start cutting line may have a length equal to or greater than about 500 μm and equal to or smaller than about 750 μm.

The laser beam may rotate along the moving path multiple times in the radiating of the laser beam along the moving path.

The method may further include: radiating the laser beam to a second start point defined inside the hole formation area and spaced apart from the first start point; radiating the laser beam to a direction toward the moving path from the second start point; radiating the laser beam along the moving path; and radiating the laser beam to a direction toward a second end point defined inside the hole formation area from the moving path.

The method may further include removing the protective film from the set module.

The laser beam may include at least one of a picosecond laser beam and a femtosecond laser beam.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
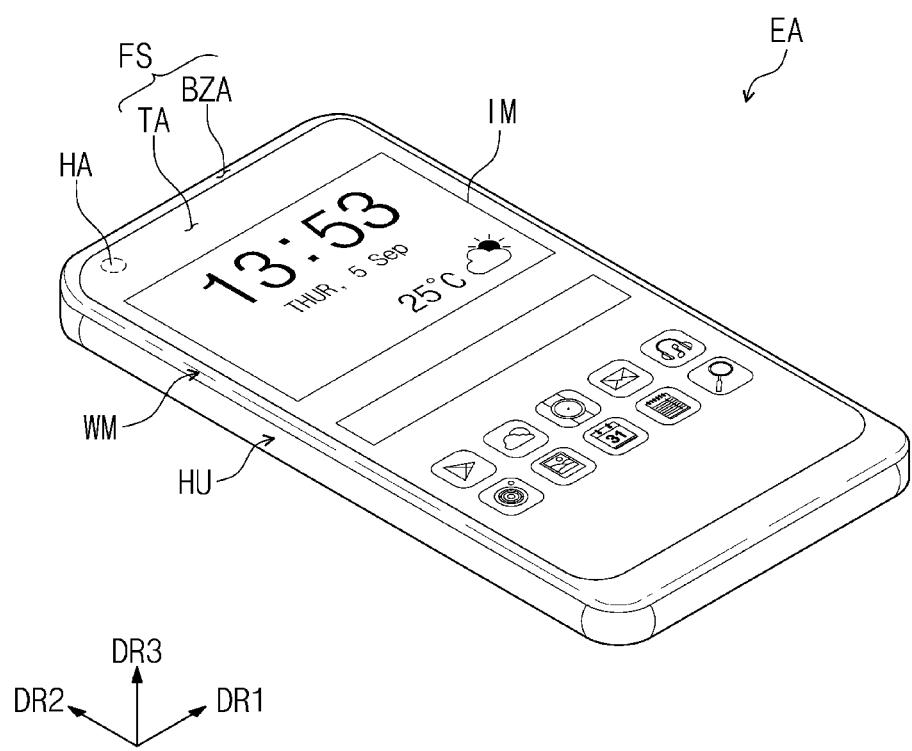
FIG. 1 is an assembled perspective view showing an electronic apparatus according to an exemplary embodiment of the present disclosure.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2A:
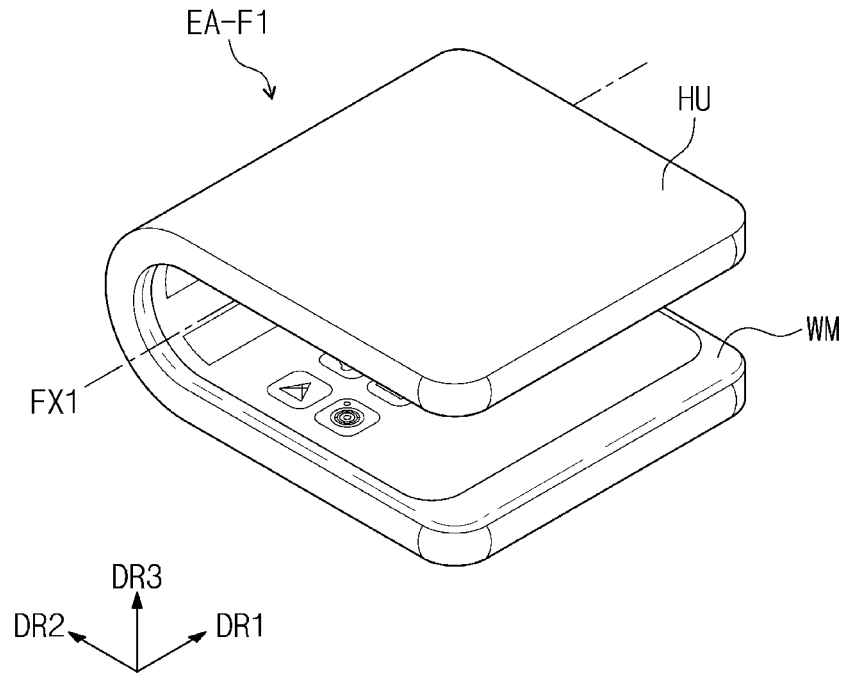
FIGS. 2A and 2B are perspective views showing the electronic apparatus according to an exemplary embodiment of the present disclosure.
Figure 2B:
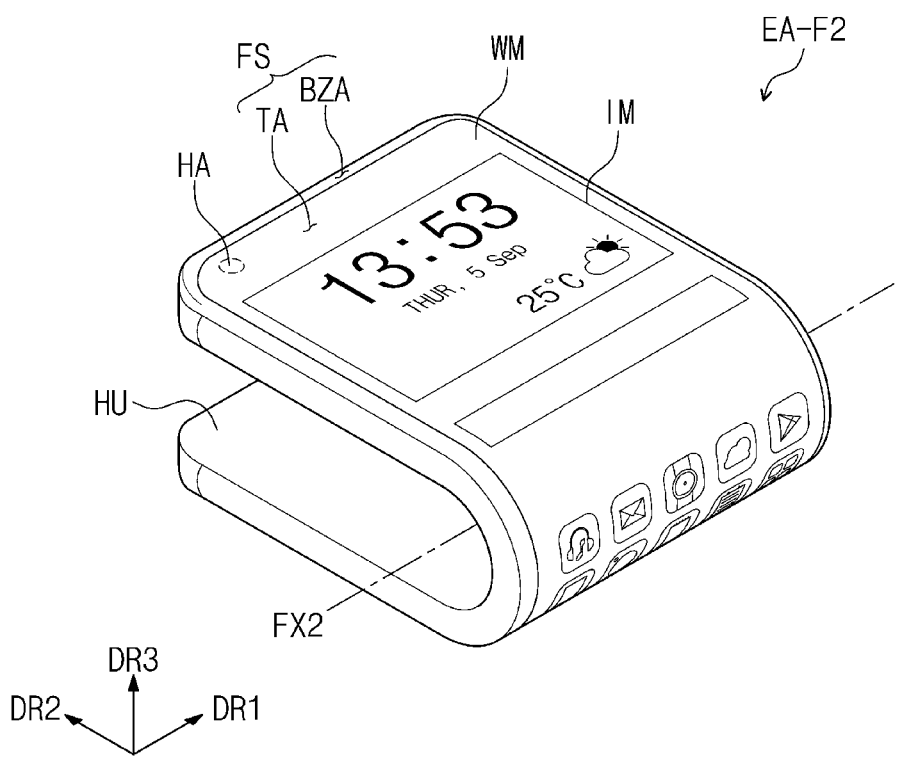

FIG. 1 is an assembled perspective view showing an electronic apparatus EA according to an exemplary embodiment of the present disclosure. FIGS. 2A and 2B are perspective views showing electronic apparatuses according to an exemplary embodiment of the present disclosure. FIG. 2A shows a perspective view of the electronic apparatus EA shown in FIG. 1 in a first mode, and FIG. 2B shows a perspective view of the electronic apparatus EA shown in FIG. 1 in a second mode. Hereinafter, the present disclosure will be described with reference to FIGS. 1, 2A, and 2B.

The electronic apparatus EA may be an apparatus activated in response to electrical signals applied thereto. The electronic apparatus EA may include various embodiments. For example, the electronic apparatus EA may be a tablet computer, a notebook computer, a computer, or a smart television. In the present exemplary embodiment, a smartphone will be described as a representative example of the electronic apparatus EA.

The electronic apparatus EA displays an image IM through a transmission area TA. The image IM includes at least one of a still image and a motion image. FIG. 1 shows a clock widget and application icons as a representative example of the image IM.

The transmission area TA may have a quadrangular shape substantially parallel to each of a first direction DR1 and a second direction DR2, however, this is merely exemplary. The transmission area TA may include various shapes and should not be particularly limited.

A bezel area BZA is defined adjacent to the transmission area TA. The bezel area BZA may surround the transmission area TA. However, this is merely exemplary, and the bezel area BZA may be defined adjacent to only one side of the transmission area TA or may be omitted. The electronic apparatus EA according to the exemplary embodiment of the present disclosure may include various embodiments and should not be limited to a particular embodiment.

A hole area HA may be defined in the electronic apparatus EA according to the exemplary embodiment of the present disclosure. The hole area HA may overlap an electronic module EM (refer to FIG. 3A) described later. That is, the hole area HA may be an area where a camera or the like is disposed to photograph an external subject or an area where an optical sensor is disposed to sense a light. The image IM may be displayed while surrounding at least a portion of an edge of the hole area HA. In the present exemplary embodiment, the image IM may be displayed while surrounding the hole area HA. This will be described in detail later.

A tangential line direction of a front surface FS may correspond to a thickness direction DR3 (hereinafter, referred to as a "third direction") of the electronic apparatus EA. In the present exemplary embodiment, front (or upper) and rear (or lower) surfaces of each member are defined with respect to a direction in which the image IM is displayed. The front and rear surfaces are opposite to each other in the third direction DR3.

Directions indicated by the first, second, and third directions DR1, DR2, and DR3 are relative to each other and may be changed to other directions. Hereinafter, the first, second, and third directions are respectively indicated by the first, second, and third directions DR1, DR2, and DR3 and assigned with the same reference numerals.

The electronic apparatus EA may have an appearance defined by a window WM and an external case HU. The front surface FS of the electronic apparatus EA may be defined in the window WM.

Referring to FIGS. 2A and 2B, the electronic apparatus EA may be folded with respect to predetermined folding axes FX1 and FX2. As shown in FIG. 2A, an electronic apparatus EA-F1 may be folded with respect to a first folding axis FX1. The first folding axis FX1 may be defined on the window WM. Accordingly, the electronic apparatus EA-F1 may be folded such that different portions of the window WM face each other and the external case HU is exposed to the outside in the first mode.

As shown in FIG. 2B, an electronic apparatus EA-F2 may be folded with respect to a second folding axis FX2. The second folding axis FX2 may be defined on the external case HU. Therefore, the electronic apparatus EA-F2 may be folded such that different portions of the external case HU face each other and the window WM is exposed to the outside in the second mode. The image displayed by the electronic apparatus EA-F2 may be easily viewed by a user in the folding state of the electronic apparatus EA-F2.

The first folding axis FX1 and the second folding axis FX2 may be substantially simultaneously present in the electronic apparatus EA. In this case, the electronic apparatus EA may be transformed to the electronic apparatus EA-F1 of the first mode or the electronic apparatus EA-F2 of the second mode depending on a direction of an external force applied thereto. As another way, the first folding axis FX1 and the second folding axis FX2 may be selectively present in the electronic apparatus EA. Meanwhile, an extension direction of the first folding axis FX1 and the second folding axis FX2 may be defined in various directions without being limited to directions shown in FIGS. 2A and 2B and should not be limited to a particular embodiment.

The electronic apparatus EA may be folded with respect to the folding axes FX1 and FX2, however, this is merely exemplary. The electronic apparatus EA may have a rigid characteristic not to be folded and should not be limited to a particular embodiment.

Figure 3A:
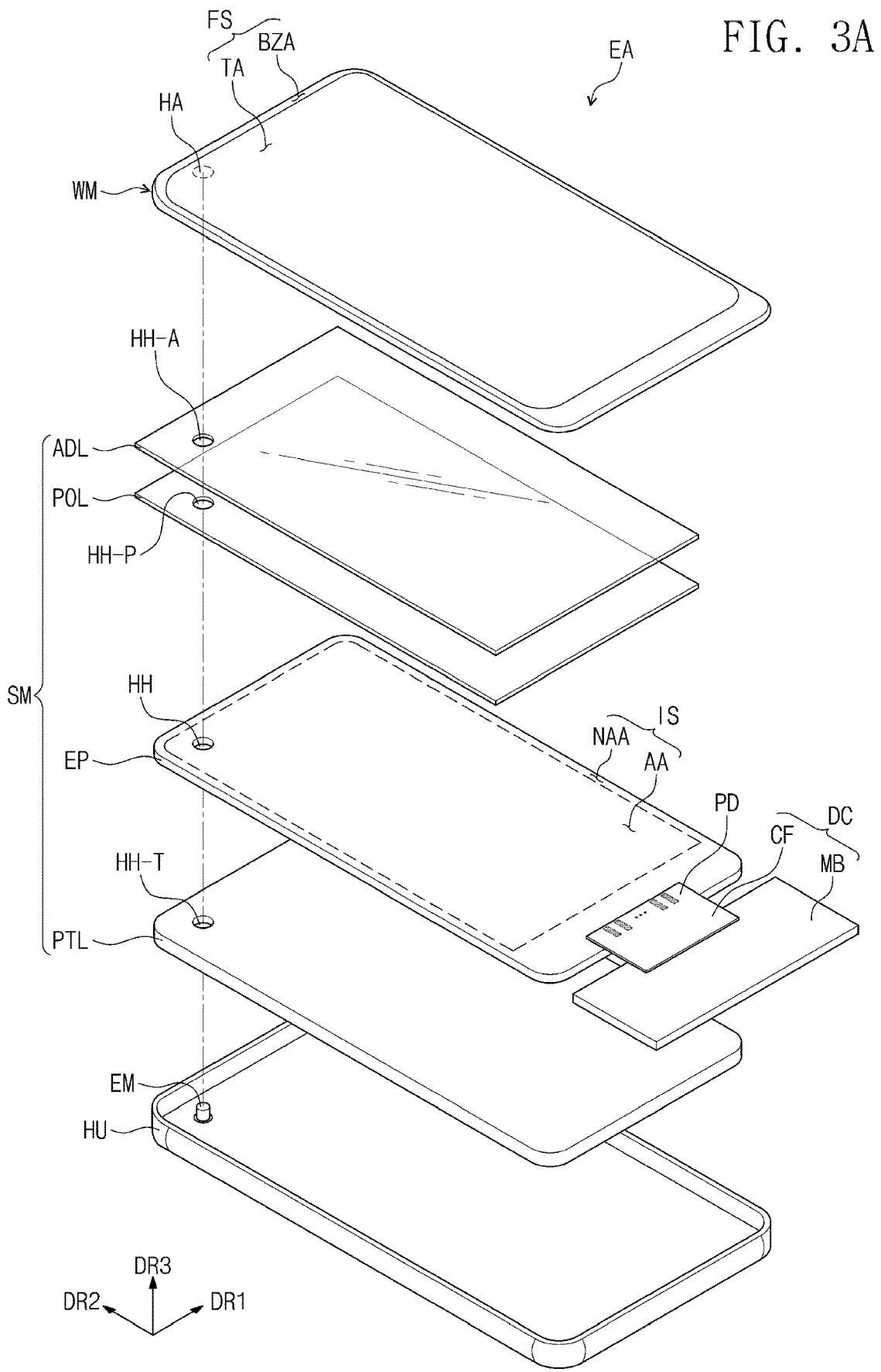
FIG. 3A is an exploded perspective view showing the electronic apparatus according to an exemplary embodiment of the present disclosure.
Figure 3B:
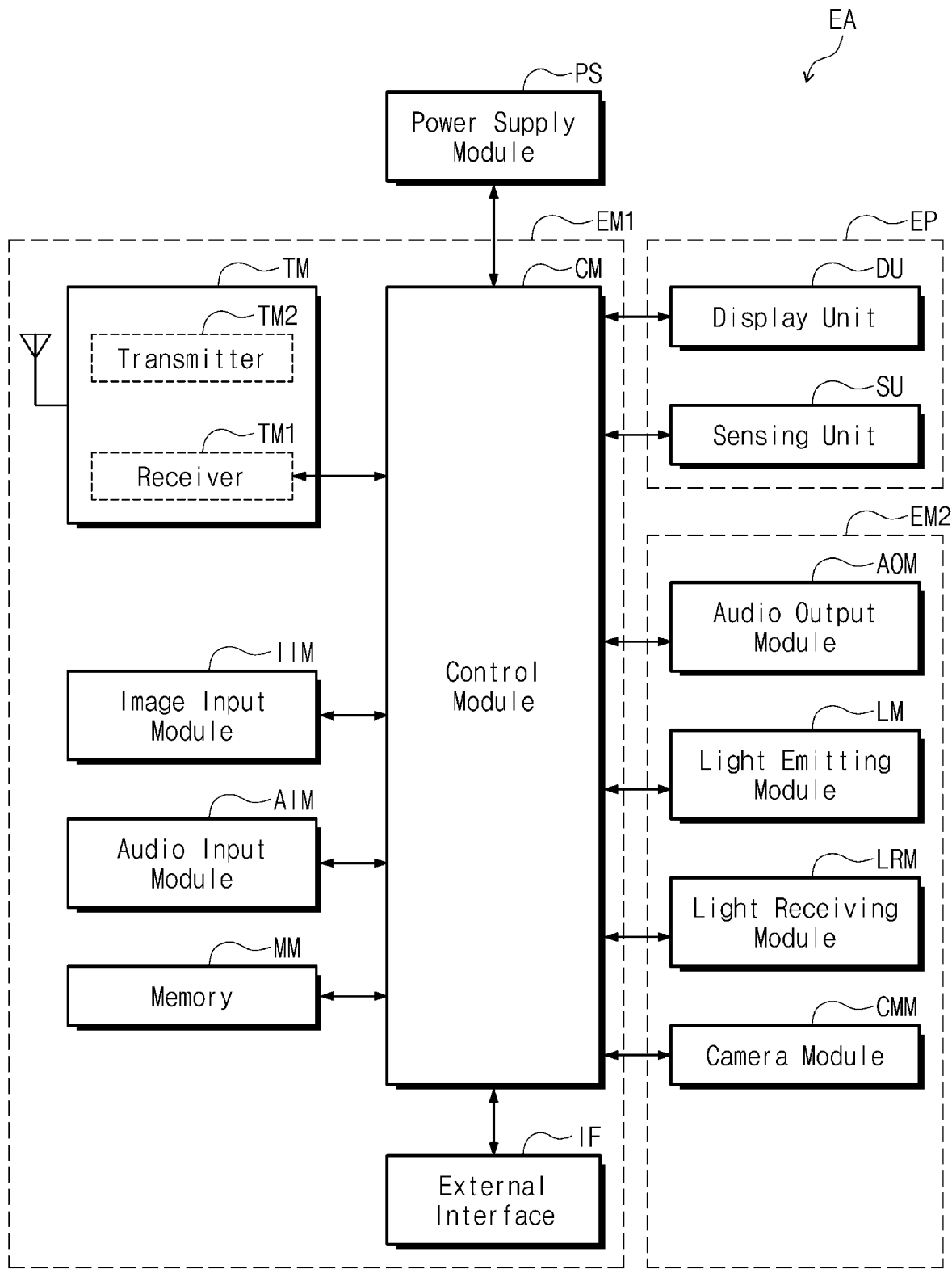
FIG. 3B is a block diagram showing the electronic apparatus shown in FIG. 3A.

FIG. 3A is an exploded perspective view showing the electronic apparatus EA according to an exemplary embodiment of the present disclosure. FIG. 3B is a block diagram showing the electronic apparatus EA shown in FIG. 3A. Hereinafter, the present disclosure will be described with reference to FIGS. 3A and 3B.

Referring to FIG. 3A, the electronic apparatus EA may include the window WM, a set module SM, the electronic module EM, and the external case HU.

In the present exemplary embodiment, the set module SM may include an electronic panel EP, an optical film POL, an adhesive layer ADL, a circuit board DC, and a protective layer PTL. As described above, the window WM and the external case HU are coupled to each other to define the appearance of the electronic apparatus EA.

The window WM may be disposed on the electronic panel EP and covers a front surface IS of the electronic panel EP. The window WM may include an optically transparent insulating material. In addition, the window WM may have flexibility. For example, the window WM may include a resin film of polyimide, a resin substrate, or a thin glass substrate.

The window WM may have a single-layer or multi-layer structure. For example, the window WM may have a stacked structure in which a plurality of plastic films is coupled to each other by an adhesive or may have a stacked structure in which a glass substrate and a plastic film are coupled to each other by an adhesive.

The window WM may include the front surface FS exposed to the outside. The front surface FS of the electronic apparatus EA may be defined by the front surface FS of the window. In detail, the transmission area TA may be an optically transparent area. The transmission area TA may have a shape corresponding to an active area AA. For example, the transmission area TA may overlap an entire portion or at least a portion of the active area AA. The image IM displayed through the active area AA of the electronic panel EP may be viewed from the outside through the transmission area TA.

The bezel area BZA may be an area that has a relatively low light transmittance compared with the transmission area TA. The bezel area BZA may define the shape of the transmission area TA. The bezel area BZA may be defined adjacent to the transmission area TA and may surround the transmission area TA.

The bezel area BZA may have a predetermined color. When the window WM is a glass or plastic substrate, the bezel area BZA may be a color layer printed or deposited on a surface of the glass or plastic substrate. As another way, the bezel area BZA may be formed by coloring a corresponding area of the glass or plastic substrate.

The bezel area BZA may cover a peripheral area NAA of the electronic panel EP to prevent or cover the peripheral area NAA from being viewed from the outside, however, this is merely exemplary. The bezel area BZA may be omitted from the window WM according to the exemplary embodiment of the present disclosure.

The electronic panel EP may display the image IM. The electronic panel EP may include the front surface IS in which the active area AA and the peripheral area NAA are defined. The active area AA may be an area activated in response to electrical signals.

In the present exemplary embodiment, the active area AA may be the area through which the image IM is displayed. The transmission area TA may overlap at least the active area AA. For example, the transmission area TA may overlap the entire portion or at least a portion of the active area AA. Accordingly, the user may view the image IM through the transmission area TA.

The peripheral area NAA may be covered by the bezel area BZA. The peripheral area NAA may be defined adjacent to the active area AA. The peripheral area NAA may surround the active area AA. A driving circuit or a driving line may be arranged in the peripheral area NAA to drive the active area AA.

Various signal lines, pads PD, or electronic elements may be disposed in the peripheral area NAA to apply electrical signals to the active area AA. The peripheral area NAA may be covered by the bezel area BZA, and thus, the peripheral area NAA may not be viewed from the outside.

In the present exemplary embodiment, the electronic panel EP may be assembled in a flat state such that the active area AA and the peripheral area NAA face the window WM, however, this is merely exemplary. That is, a portion of the peripheral area NAA of the electronic panel EP may be curved. In this case, the portion of the peripheral area NAA may face a rear surface of the electronic apparatus EA, and thus, the bezel area BZA in the front surface of the electronic apparatus EA may be reduced. As another way, the electronic panel EP may be assembled to allow a portion of the active area AA to be curved. Further, the peripheral area NAA may be omitted from the electronic panel EP according to the exemplary embodiment of the present disclosure.

A panel hole HH may be defined through the electronic panel EP. At least a portion of the panel hole HH may be surrounded by the active area AA. In the present exemplary embodiment, the panel hole HH may be spaced apart from the peripheral area NAA. The panel hole HH may be defined in the active area AA such that an edge thereof is entirely surrounded by the active area AA. In the assembled state of the electronic apparatus EA according to the present exemplary embodiment, the panel hole HH may be formed at a position that overlaps the transmission area TA and is spaced apart from the bezel area BZA.

The circuit board DC may be connected to the electronic panel EP. The circuit board DC may include a flexible board CF and a main board MB. The flexible board CF may include an insulating film and conductive lines mounted on the insulating film. The conductive lines may be connected to the pads PD to electrically connect the circuit board DC and the electronic panel EP.

In the present exemplary embodiment, the flexible board CF may be assembled in a curved state. Accordingly, the main board MB may be disposed on the rear surface of the electronic panel EP and may be stably accommodated in a space provided by the external case HU. Meanwhile, in the present exemplary embodiment, the flexible board CF may be omitted, and in this case, the main board MB may be directly connected to the electronic panel EP.

The main board MB may include signal lines and electronic elements, which are not shown in figures. The electronic elements may be connected to the signal lines and may be electrically connected to the electronic panel EP. The electronic elements may generate various electrical signals, e.g., a signal used to generate the image IM or a signal used to sense an external input, and may process the sensed signals. Meanwhile, the main board MB may be provided in a plural number to correspond to every electrical signal generated and processed thereby, however, it should not be limited to a particular embodiment.

Meanwhile, in the electronic apparatus EA according to an exemplary embodiment of the present disclosure, the driving circuit applying the electrical signal to the active area AA may be directly mounted on the electronic panel EP. In the present exemplary embodiment, the driving circuit may be mounted in a chip form or may be formed together with the pixels PX. In this case, an area of the circuit board DC may be reduced or the circuit board DC may be omitted. The electronic apparatus EA according to the exemplary embodiment of the present disclosure may include various embodiments, and it should not be limited to a specific embodiment.

The optical film POL may be disposed between the window WM and the electronic panel EP. The optical film POL may decrease a reflectance of an external light incident thereto from the outside of the window WM with respect to the electronic panel EP. In the present exemplary embodiment, the optical film POL may include a polarization film or a color filter.

A predetermined hole HH-P (hereinafter, referred to as an "optical film hole") may be defined through the optical film POL. The optical film hole HH-P may be defined through an area corresponding to the panel hole HH of the electronic panel EP. In the present exemplary embodiment, the optical film hole HH-P may be defined in a location overlapping the panel hole HH and may have a shape matching with that of the panel hole HH, however, this is merely exemplary. A tolerance in position and size may exist between the optical film hole HH-P and the panel hole HH of the electronic panel EP due to process errors.

The adhesive layer ADL may be disposed between the optical film POL and the window WM. The adhesive layer ADL may couple the optical film POL and the window WM. In a case where the optical film POL according to the present disclosure is the color filter formed in the electronic panel EP, the adhesive layer ADL may substantially couple the electronic panel EP and the window WM. The adhesive layer ADL may include an optical clear adhesive, an optical clear resin, or a pressure sensitive adhesive, however, it should not be limited to a specific embodiment as long as it is optically clear.

A predetermined hole HH-A (hereinafter, referred to as an "adhesive layer hole") may be defined through the adhesive layer ADL. The adhesive layer hole HH-A may be formed along the panel hole HH of the electronic panel EP. In the present exemplary embodiment, the adhesive layer hole HH-A and the optical film hole HH-P are aligned along the panel hole HH of the electronic panel EP, however, this is merely exemplary. The adhesive layer hole HH-A and the optical film hole HH-P may form a predetermined step difference with the panel hole HH of the electronic panel EP due to the process errors.

The protective layer PTL may be disposed under the electronic panel EP. The protective layer PTL may include a plurality of layers, and the protective layer PTL may include various layers to relive a stress applied to the electronic panel EP when the electronic panel EP is folded or to protect the electronic panel EP from external impacts. For example, the protective layer PTL may include a cushion layer having a foam shape to absorb the impacts of the electronic panel EP, a light blocking layer that blocks a light from the electronic panel EP, and a heat dissipation layer that dissipates a heat generated from the electronic panel EP.

A predetermined hole HH-T (hereinafter, referred to as a "protective layer hole") may be defined through the protective layer PTL. The protective layer hole HH-T may be formed along the panel hole HH of the electronic panel EP. In the present exemplary embodiment, the protective layer hole HH-T, the adhesive layer hole HH-A, and the optical film hole HH-P are aligned to correspond to the panel hole HH of the electronic panel EP, however, this is merely exemplary. The protective layer hole HH-T, the adhesive layer hole HH-A, and the optical film hole HH-P may form a predetermined step difference with the panel hole HH of the electronic panel EP due to process errors.

The electronic module EM may be disposed under the window WM. The electronic module EM may overlap the panel hole HH in a plan view. The electronic module EM may receive the external input transmitted through the panel hole HH or may provide the output through the panel hole HH.

A receiving part that receives the external input or an output part that provides the output in the electronic module EM may overlap the panel hole HH in a plan view. According to the present disclosure, the electronic module EM may be disposed to overlap the active area AA, and thus, the bezel area BZA may be prevented or suppressed from increasing.

Referring to FIG. 3B, the electronic apparatus EA may include the electronic panel EP, a power supply module PS, a first electronic module EM1, and a second electronic module EM2. The electronic panel EP, the power supply module PS, the first electronic module EM1, and the second electronic module EM2 may be electrically connected to each other.

In FIG. 3B, a display unit DU and a sensing unit SU among configurations of the electronic panel EP are shown as a representative example. The display unit DU may include a plurality of pixels and may display the image IM. The sensing unit SU may sense the external input applied to the window WM. The external input may include various types of external inputs, such as a portion of user's body who uses the electronic apparatus EA, light, heat, or pressure provided from the outside. In addition, the electronic apparatus EA may sense a proximity input as well as a touch input to the electronic apparatus EA. The sensing unit SU may be stacked on the display unit DU or may be inserted into the display unit DU to be integrally formed with the display unit DU.

The first electronic module EM1 and the second electronic module EM2 may include various functional modules to operate the electronic apparatus EA. The first electronic module EM1 may be mounted directly on a mother board electrically connected to the electronic panel EP or may be electrically connected to the mother board via a connector (not shown) after being mounted on a separate substrate.

The first electronic module EM1 may include a control module CM, a wireless communication module TM, an image input module IIM, an audio input module AIM, a memory MM, and an external interface IF. Some modules among the modules may be electrically connected to the mother board through a flexible circuit board without being mounted on the mother board.

The control module CM may control an overall operation of the electronic apparatus EA. The control module CM may be, but not limited to, a microprocessor. For example, the control module CM may activate or deactivate the electronic panel EP. The control module CM may control other modules, such as the image input module IIM, the audio input module AIM, or the like, based on the touch signal provided from the electronic panel EP.

The wireless communication module TM may transmit/receive a wireless signal to/from other terminals using a Bluetooth or WiFi link. The wireless communication module TM may transmit/receive a voice signal using a general communication line. The wireless communication module TM may include a transmitter TM1 that modulates a signal to be transmitted and transmits the modulated signal and a receiver TM2 that demodulates the signal applied thereto.

The image input module IIM may process an image signal and may convert the image signal into image data that may be displayed through the electronic panel EP. The audio input module AIM may receive an external sound signal through a microphone in a record mode or a voice recognition mode and may convert the external sound signal to electrical voice data.

The external interface IF serves as an interface between the control module CM and external devices, such as an external charger, a wired/wireless data port, a card socket (e.g., a memory card and a SIM/UIM card), etc.

The second electronic module EM2 may include an audio output module AOM, a light emitting module LM, a light receiving module LRM, and a camera module CMM. The configurations may be mounted directly on the mother board, may be electrically connected to the electronic panel EP via a connector (not shown) after being mounted on a separate substrate, or may be electrically connected to the first electronic module EM1.

The audio output module AOM may convert the sound data provided from the wireless communication module TM or the sound data stored in the memory MM and may output the converted sound data to the outside.

The light emitting module LM may generate a light and may output the light. The light emitting module LM may emit an infrared ray. The light emitting module LM may include an LED element. The light receiving module LRM may sense the infrared ray. The light receiving module LRM may be activated when the infrared ray having a predetermined level or higher is sensed. The light receiving module LRM may include a complementary metal oxide semiconductor (CMOS) sensor. The infrared ray generated by and output from the light emitting module LM may be reflected by an external object, e.g., a user's finger or face, and the reflected infrared ray may be incident into the light receiving module LRM. The camera module CMM may take an image of an external object.

The electronic module EM according to the exemplary embodiment of the present disclosure may include at least one of the configurations of the first electronic module EM1 and the second electronic module EM2. For example, the electronic module EM may include at least one of a camera, a speaker, a light sensor, and a heat sensor. The electronic module EM may sense the external object through the panel hole HH and may provide a sound signal, such as voice, to the outside through the panel hole HH. In addition, the electronic module EM may include a plurality of configurations, and it should not be limited to a specific embodiment.

According to the present disclosure, the electronic module EM may be assembled to overlap the transmission area TA in a plan view. Thus, although the electronic module EM is accommodated, the bezel area BZA may be prevented or suppressed from increasing, and aesthetics of the electronic apparatus EA may be improved.

Figure 4A:
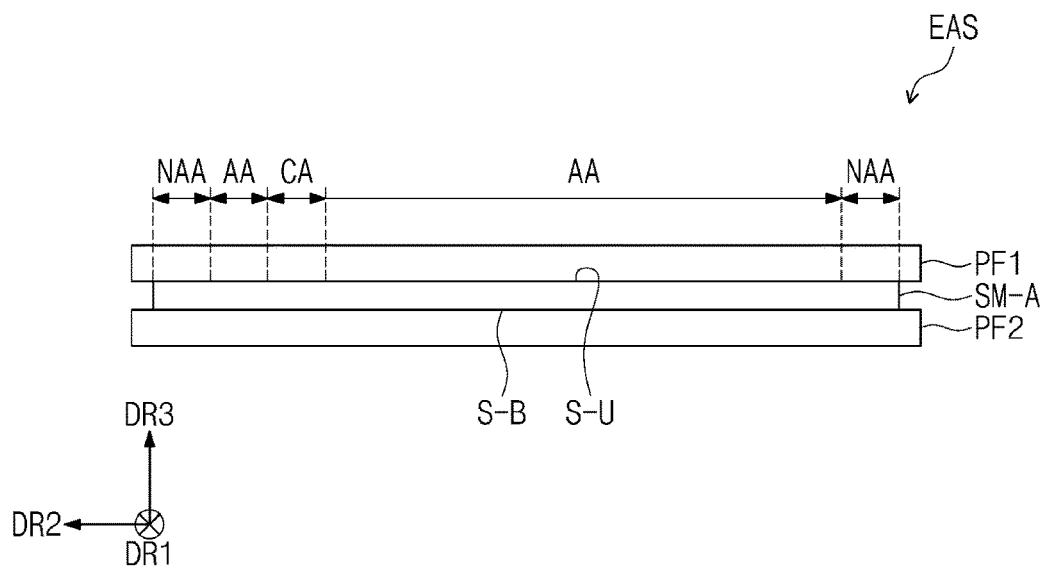
FIG. 4A is a cross-sectional view showing a method of manufacturing an electronic apparatus according to an exemplary embodiment of the present disclosure.
Figure 4B:
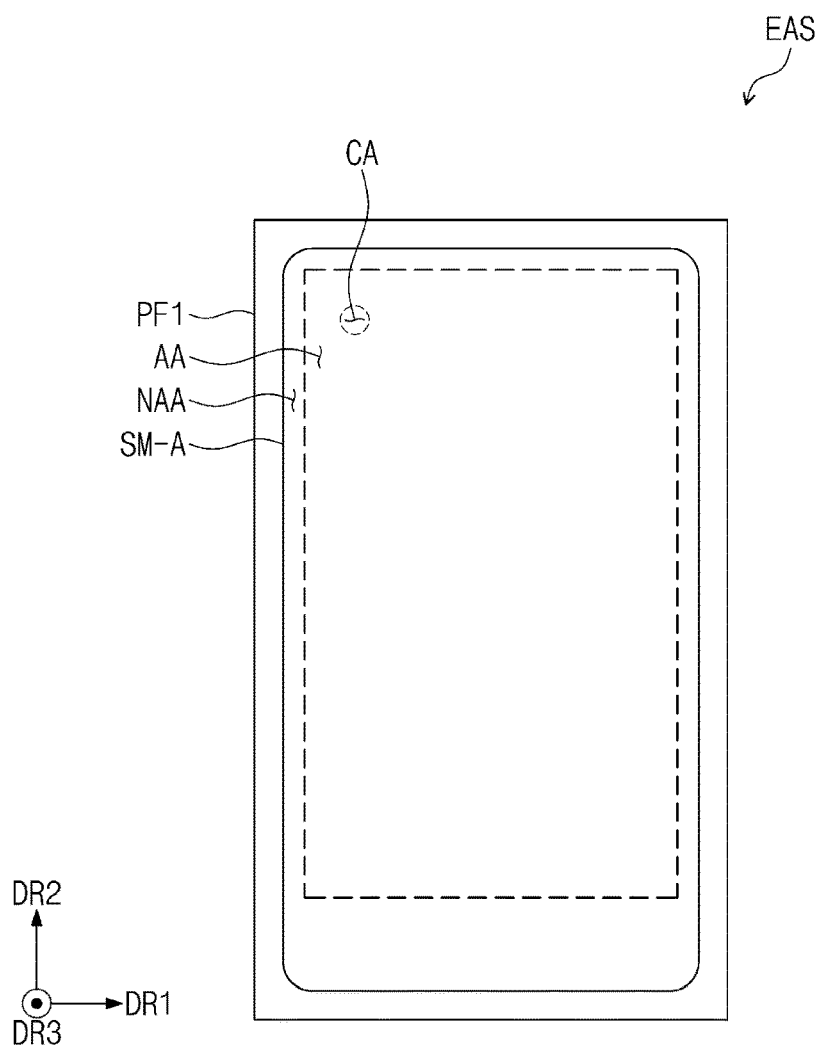
FIG. 4B is a plan view showing a method of manufacturing an electronic apparatus according to an exemplary embodiment of the present disclosure.
Figure 5A:
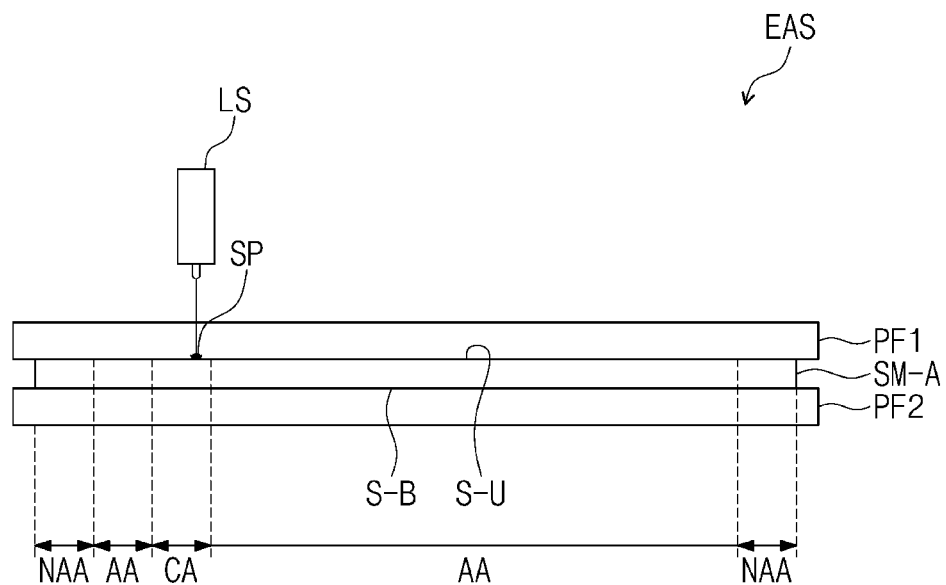
FIG. 5A is a cross-sectional view showing a method of manufacturing an electronic apparatus according to an exemplary embodiment of the present disclosure.
Figure 5B:
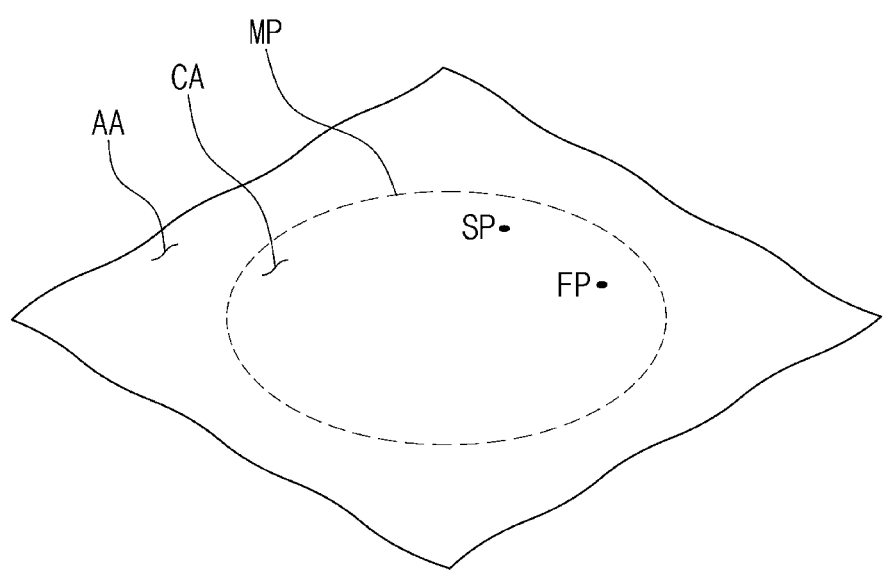
FIG. 5B is a perspective view showing a method of manufacturing an electronic apparatus according to an exemplary embodiment of the present disclosure.
Figure 6A:
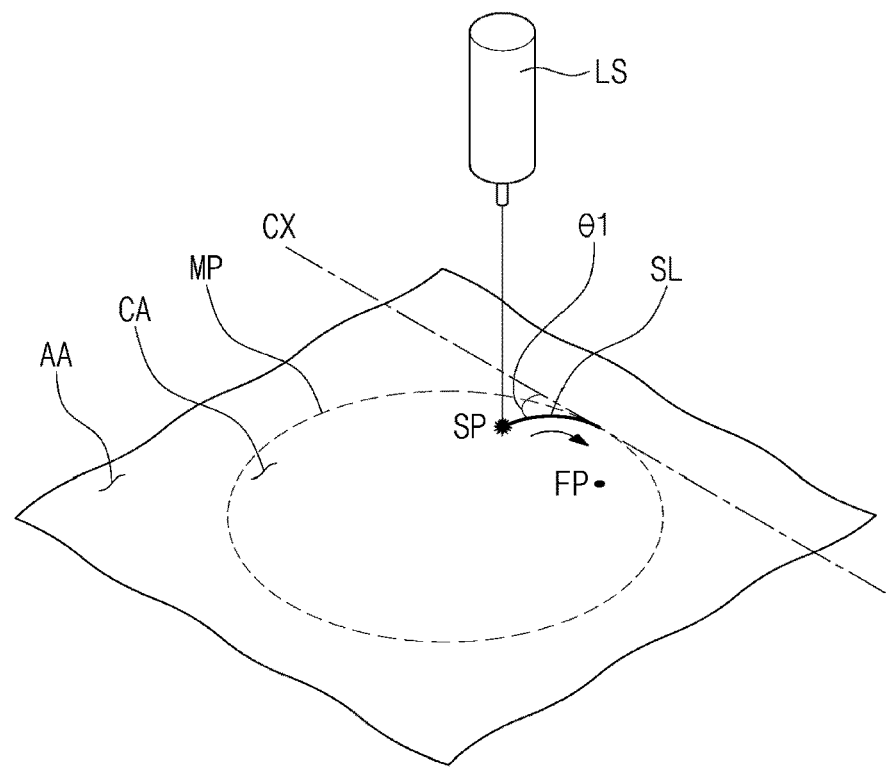
FIGS. 6A, 6B, and 6C are perspective views showing a method of manufacturing an electronic apparatus according to an exemplary embodiment of the present disclosure.
Figure 6B:
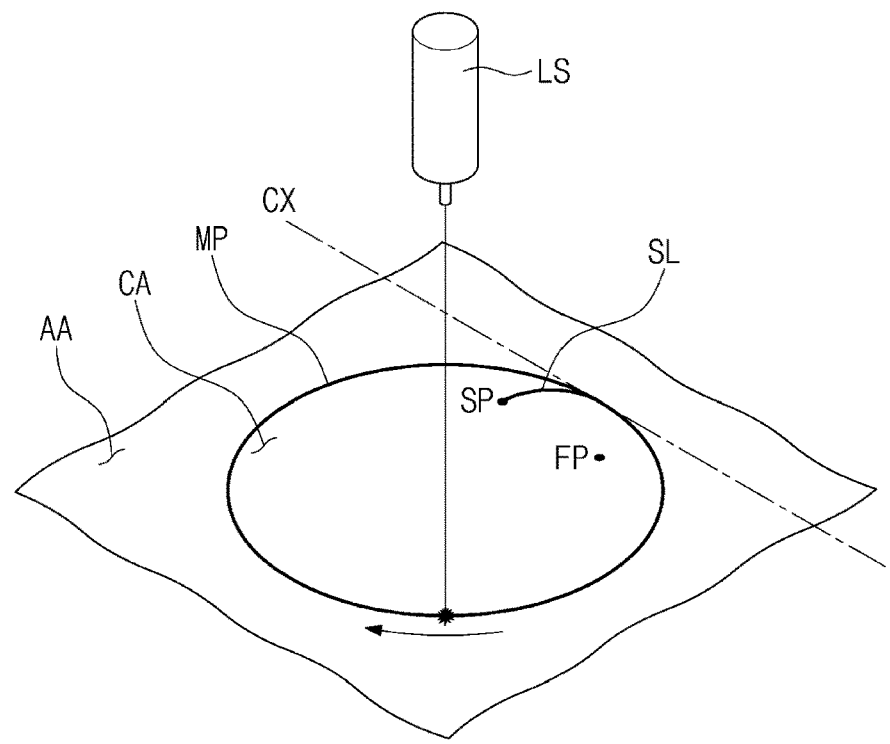
Figure 6C:
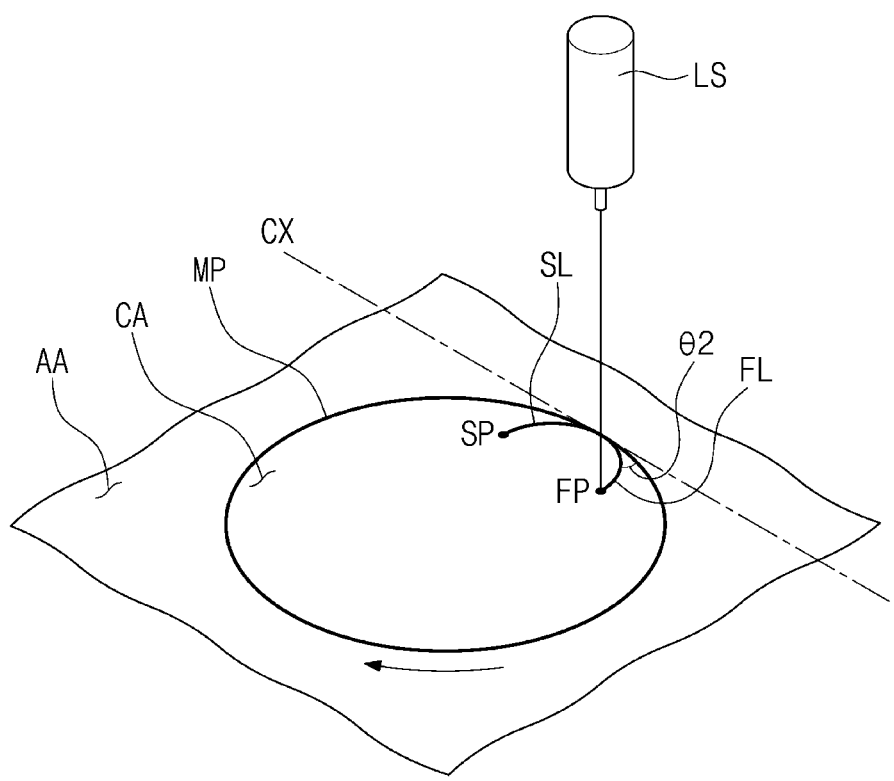
Figure 7:
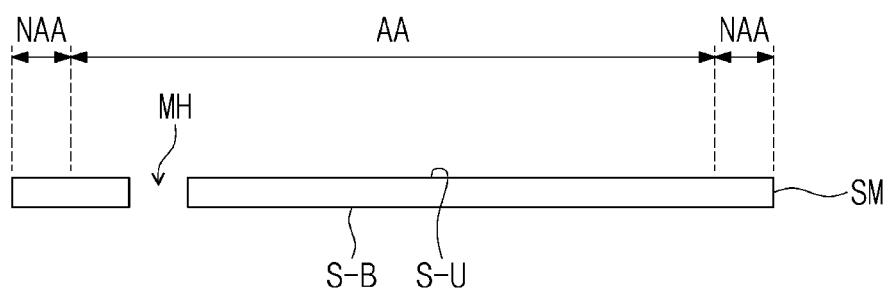
FIG. 7 is a cross-sectional view showing a method of manufacturing an electronic apparatus according to an exemplary embodiment of the present disclosure.

FIG. 4A is a cross-sectional view showing a method of manufacturing an electronic apparatus according to an exemplary embodiment of the present disclosure. FIG. 4B is a plan view showing a method of manufacturing an electronic apparatus according to an exemplary embodiment of the present disclosure. FIG. 5A is a cross-sectional view showing a method of manufacturing an electronic apparatus according to an exemplary embodiment of the present disclosure. FIG. 5B is a perspective view showing a method of manufacturing an electronic apparatus according to an exemplary embodiment of the present disclosure. FIGS. 6A, 6B, 6C are perspective views showing a method of manufacturing an electronic apparatus according to an exemplary embodiment of the present disclosure. FIG. 7 is a cross-sectional view showing a method of manufacturing an electronic apparatus according to an exemplary embodiment of the present disclosure. FIGS. 8A, 8B, 8C, 8D, and 8E are perspective views showing a method of manufacturing an electronic apparatus according to an exemplary embodiment of the present disclosure.

Hereinafter, the manufacturing method of the electronic apparatus according to the exemplary embodiment of the present disclosure will be described with reference to FIGS. 4A, 4B, 5A, 5B, 6A, 6B, 6C 7, 8A, 8B, 8C, 8D, and 8E. In more detail, the manufacturing method of the electronic apparatus, which forms the holes HH-A, HH, and HH-T overlapping the electronic module EM in the set module SM (refer to FIG. 3A), will be described. In FIGS. 4A, 4B, 5A, 5B, 6A, 6B, 6C 7, 8A, 8B, 8C, 8D, and 8E, the same/similar reference numerals denote the same/similar elements in FIGS. 1, 2A, 2B, 3A, and 3B, and thus, detailed descriptions of the same/similar elements having the same/similar reference numerals will be omitted.

The manufacturing method of the electronic apparatus according to the present exemplary embodiment may include providing a work substrate EAS. The work substrate EAS may include a preliminary set module SM-A and protective films PF1 and PF2.

In the present exemplary embodiment, the preliminary set module SM-A may be defined as a module in a state before the holes HH-A, HH-P, HH, and HH-T are formed in components included in the set module SM described in FIG. 3A. Accordingly, the preliminary set module SM-A may include the electronic panel EP, the optical film POL, the adhesive layer ADL, and the protective layer PTL, which are respectively in states before the holes HH-A, HH-P, HH, and HH-T are formed. For the convenience of explanation, the circuit board DC will be omitted in the following drawings.

Referring to FIGS. 4A and 4B, the preliminary set module SM-A includes the active area AA including a hole formation area CA and the peripheral area NAA defined adjacent to the active area AA. In addition, the preliminary set module SM-A includes an upper surface S-U and a rear surface S-B opposite to the upper surface S-U.

FIG. 4B shows the hole formation area CA defined at a left upper end of the active area AA, however, the location of the hole formation area CA should not be limited thereto or thereby. For example, the hole formation area CA may be defined as the area that overlaps the electronic module EM shown in FIG. 3A, and the shape and the number of the hole formation areas CA should not be particularly limited as long as the hole formation area CA is defined inside the active area AA.

The protective films PF1 and PF2 may be disposed on at least one of the upper surface S-U and the rear surface S-B of the preliminary set module SM-A. Although not shown in figures, the protective films PF1 and PF2 may be attached to the preliminary set module SM-A by an adhesive layer.

The protective films PF1 and PF2 may protect the preliminary set module SM-A from external impacts generated when the preliminary set module SM-A is transported and assembled. The protective films PF1 and PF2 may prevent or suppress external moisture from entering the preliminary set module SM-A and may absorb the external impacts. In addition, the protective films PF1 and PF2 may prevent or suppress residues generated when the hole is formed through the preliminary set module SM-A from entering the preliminary set module SM-A.

The protective films PF1 and PF2 may protect the display module DM. The protective films PF1 and PF2 may provide a outer surface exposed to the outside and may provide an adhesive surface attached to a adhesive member. The protective films PF1 and PF2 may prevent or suppress external moisture from entering the display module DM and may absorb the external impacts.

The protective films PF1 and PF2 may include a plastic film as its base layer. The protective films PF1 and PF2 may include the plastic film containing one selected from the groups consisting of polyethersulphone (PES), polyacrylate (PAR), polyether imide (PEI), polyethylene naphthalate (PEN), polyethylene terephthalate (PET), polyphenylene sulfide (PPS), polyallylate, polyimide (PI), polycarbonate (PC), poly(aryleneether sulfone), and combinations thereof.

The material for the protective films PF1 and PF2 should not be limited to plastic resins and may include an organic-inorganic composite material. The protective films PF1 and PF2 may include a porous organic layer and an inorganic material filled in pores of the organic layer. The protective films PF1 and PF2 may further include a functional layer formed in the plastic film. The functional layer may include a resin layer. The functional layer may be formed by a coating method. According to an exemplary embodiment of the present disclosure, the protective films PF1 and PF2 may be omitted.

The manufacturing method of the electronic apparatus according to the present exemplary embodiment may include radiating a laser beam to a first start point SP defined inside the hole formation area.

Referring to FIGS. 5A and 5B, a laser unit LS may radiate a laser beam onto the upper surface S-U of the preliminary set module SM-A. The laser beam may be radiated from a predetermined point defined inside the hole formation area CA defined through the active area AA of the preliminary set module SM-A. For example, the laser beam of the present exemplary embodiment may be radiated from the first start point SP defined inside the hole formation area CA.

According to the present disclosure, a boundary between the hole formation area CA and the active area AA may be defined as a path along which the laser beam is radiated, i.e., a moving path MP of the laser unit LS. Accordingly, the laser beam may be radiated along the moving path MP to remove an area of the preliminary set module SM-A, which overlaps the hole formation area CA. In the present exemplary embodiment, the laser beam may be a picosecond laser beam or a femtosecond laser beam.

The manufacturing method of the electronic apparatus according to the present exemplary embodiment may include radiating the laser beam from the first start point SP to a direction toward the moving path MP.

Referring to FIG. 6A, the laser unit LS may move from the first start point SP toward the moving path MP while radiating the laser beam. When the laser unit LS is operated, an intensity of an initial laser beam in a preheating stage may be weaker than an intensity of the laser beam right before entering the moving path MP. According to the present disclosure, the radiation of the initial laser beam starts from the first start point SP defined inside the hole formation area CA to uniformly maintain the intensity of the laser beam radiated onto the moving path MP. Therefore, the laser beam having the uniform intensity may be radiated onto the moving path MP.

According to the present disclosure, the laser beam may have the intensity equal to or greater than about 5 W and equal to or smaller than about 10 W. The laser unit LS may move along the moving path MP at a processing speed equal to or greater than about 300 nm/s and equal to or smaller than about 5000 nm/s. In addition, the laser beam has a frequency equal to or greater than about 400 KHz and equal to or smaller than about 2 MHz.

According to the present disclosure, a first start cutting line SL may be formed in the hole formation area CA. The first start cutting line SL may be formed by removing at least a portion along a thickness direction of the work substrate EAS through a process of radiating the laser beam from the first start point SP to the moving path MP.

The first start cutting line SL may have a predetermined angle θ1 with respect to a tangential line CX of a point at which the first start cutting line SL meets the moving path MP. The angle θ1 may be equal to or greater than about 10 degrees and equal to or smaller than about 90 degrees.

The first start cutting line SL may have a curved shape with a predetermined curvature, however, the first start cutting line SL should not be limited to the curved shape. That is, the first start cutting line SL may have a straight line.

The first start cutting line SL may have a length, i.e., a length from the first start point SP to the moving path MP, which is equal to or greater than about 500 μm and equal to or smaller than about 750 μm.

The manufacturing method of the electronic apparatus according to the present exemplary embodiment may include radiating the laser beam along the moving path.

Referring to FIG. 6B, the laser unit LS may start moving from the first start cutting line SL to enter the moving path MP while forming the first start cutting line SL. In this case, the laser unit LS may rotate multiple times along the moving path MP and may radiate the laser beam of a uniform intensity. For example, the laser unit LS may rotate along the moving path MP within a range equal to or greater than one time and equal to or smaller than 150 times.

Referring to FIG. 6C, the laser unit LS may move from the moving path MP to a first end point FP inside the hole formation area. According to the exemplary embodiments, after the laser unit LS is radiated onto the moving path MP, the laser unit LS may be radiated from the moving path MP to the first end point FP inside the hole formation area. According to the present disclosure, the radiation of the initial laser beam ends at the first end point FP defined inside the hole formation area CA to uniformly maintain the intensity of the laser beam radiated onto the moving path MP. Therefore, the laser beam having the uniform intensity may be radiated onto the moving path MP.

According to the present disclosure, a first end cutting line FL may be formed in the hole formation area CA. The first end cutting line FL may be formed by removing at least a portion along a thickness direction of the work substrate EAS through a process of radiating the laser beam from the moving path MP to the first end point FP.

The first end cutting line FL may have a predetermined angle θ2 with respect to a tangential line CX of a point at which the first end cutting line FL meets the moving path MP. The angle θ2 may be equal to or greater than about 10 degrees and equal to or smaller than about 90 degrees.

The first end cutting line FL may have a curved shape with a predetermined curvature, however, the first end cutting line FL should not be limited to the curved shape. That is, the first end cutting line FL may have a straight line.

The first end cutting line FL may have a length, i.e., a length from the moving path MP to the first end point FP, which is equal to or greater than about 500 μm and equal to or smaller than about 750 μm.

The manufacturing method of the electronic apparatus according to the present exemplary embodiment may include forming the set module in which a module hole is defined by removing the hole formation area from the preliminary set module and removing the protective film from the set module.

Referring to FIG. 7, the hole formation area CA may be removed from the preliminary set module SM-A by radiating the laser beam along the moving path MP using the laser unit LS. The portion from which the hole formation area CA is removed may be defined as the module hole MH. The module hole MH may be defined by the adhesive layer hole HH-A, the optical film hole HH-P, the panel hole HH, and the protective layer hole HH-T, which are shown in FIG. 3A and aligned with each other.

FIGS. 8A, 8B, 8C, 8D, and 8E are perspective views showing a method of manufacturing an electronic apparatus according to an exemplary embodiment of the present disclosure.

Figure 8A:
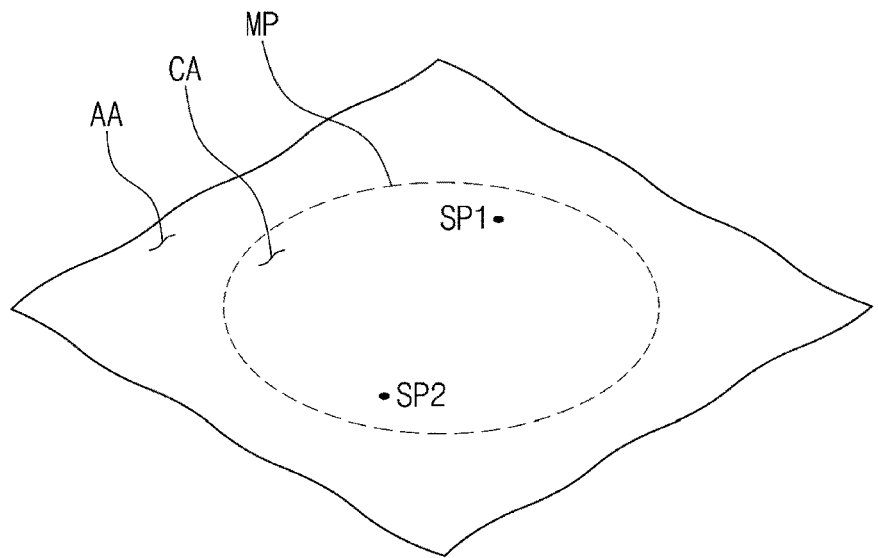
FIGS. 8A, 8B, 8C, 8D, and 8E are perspective views showing a method of manufacturing an electronic apparatus according to an exemplary embodiment of the present disclosure.

Referring to FIG. 8A, a laser unit LS may radiate a laser beam onto the upper surface S-U of the preliminary set module SM-A. The laser beam may be radiated from a predetermined point defined inside the hole formation area CA defined through the active area AA of the preliminary set module SM-A. For example, the laser beam of the present exemplary embodiment may be radiated from the first start point SP1 defined inside the hole formation area CA.

The manufacturing method of the electronic apparatus according to the present exemplary embodiment may include radiating the laser beam from the first start point SP1 to a direction toward the moving path MP.

Figure 8B:
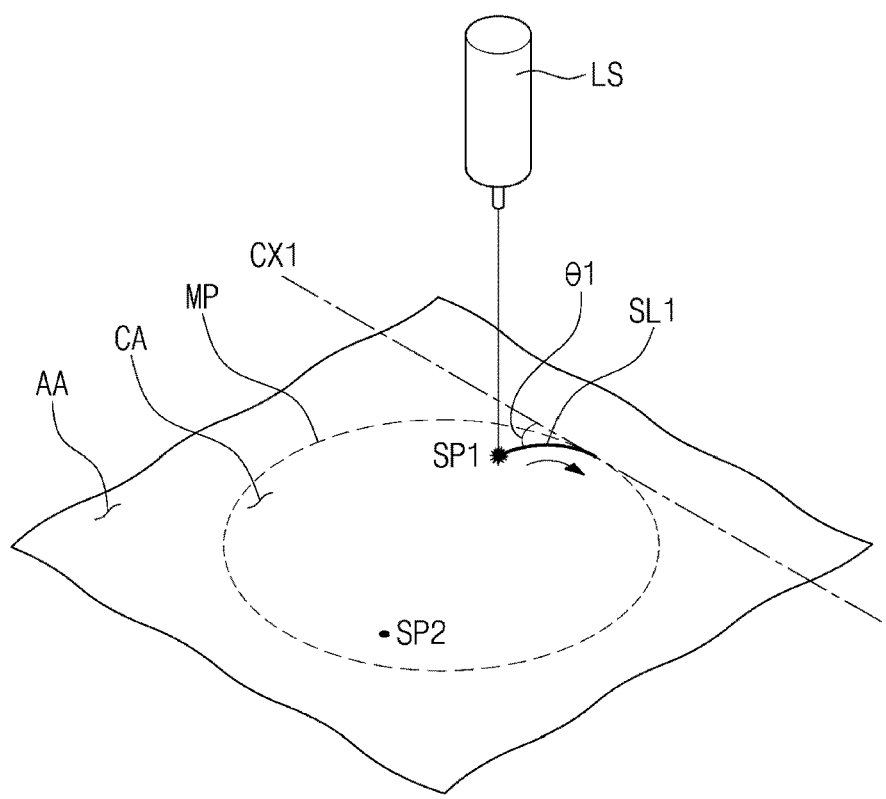

Referring to FIG. 8B, the laser unit LS may move from the first start point SP1 toward the moving path MP while radiating the laser beam. When the laser unit LS is operated, an intensity of an initial laser beam in a preheating stage may be weaker than an intensity of the laser beam right before entering the moving path MP. According to the present disclosure, the radiation of the initial laser beam starts from the first start point SP1 defined inside the hole formation area CA to uniformly maintain the intensity of the laser beam radiated onto the moving path MP. Therefore, the laser beam having the uniform intensity may be radiated onto the moving path MP.

According to the present disclosure, a first start cutting line SL1 may be formed in the hole formation area CA. The first start cutting line SL1 may be formed by removing at least a portion along a thickness direction of the work substrate EAS through a process of radiating the laser beam from the first start point SP1 to the moving path MP.

The first start cutting line SL1 may have a predetermined angle θ1 with respect to a tangential line CX1 of a point at which the first start cutting line SL1 meets the moving path MP. The angle θ1 may be equal to or greater than about 10 degrees and equal to or smaller than about 90 degrees.

The first start cutting line SL1 may have a curved shape with a predetermined curvature, however, the first start cutting line SL1 should not be limited to the curved shape. That is, the first start cutting line SL1 may have a straight line.

The first start cutting line SL1 may have a length, i.e., a length from the first start point SP1 to the moving path MP, which is equal to or greater than about 500 µm and equal to or smaller than about 750 µm.

The manufacturing method of the electronic apparatus according to the present exemplary embodiment may include radiating the laser beam along the moving path.

Figure 8C:
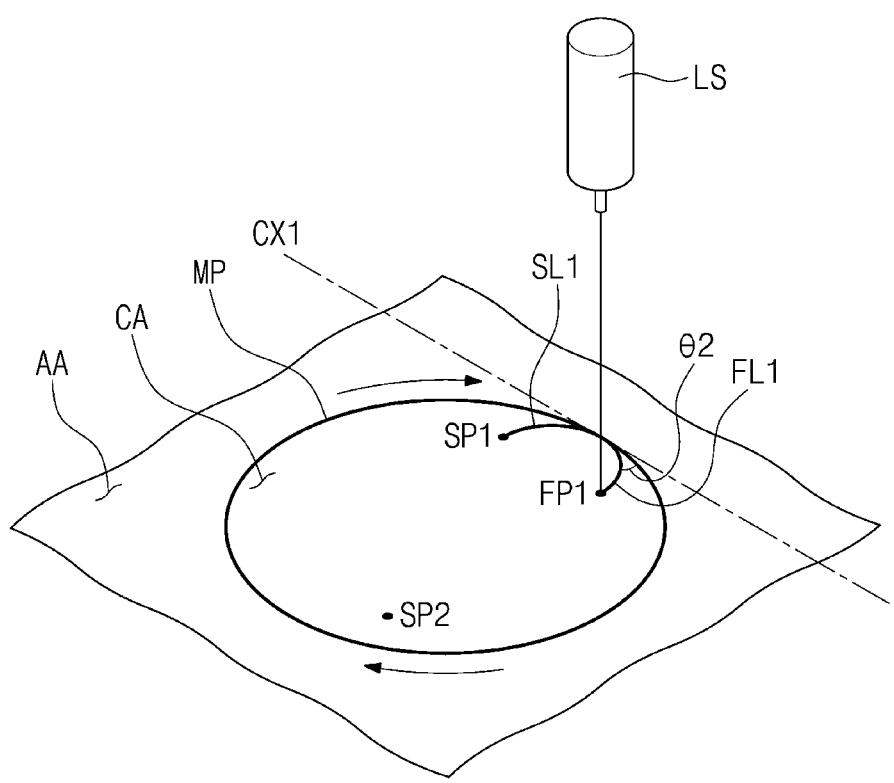
Figure 8D:
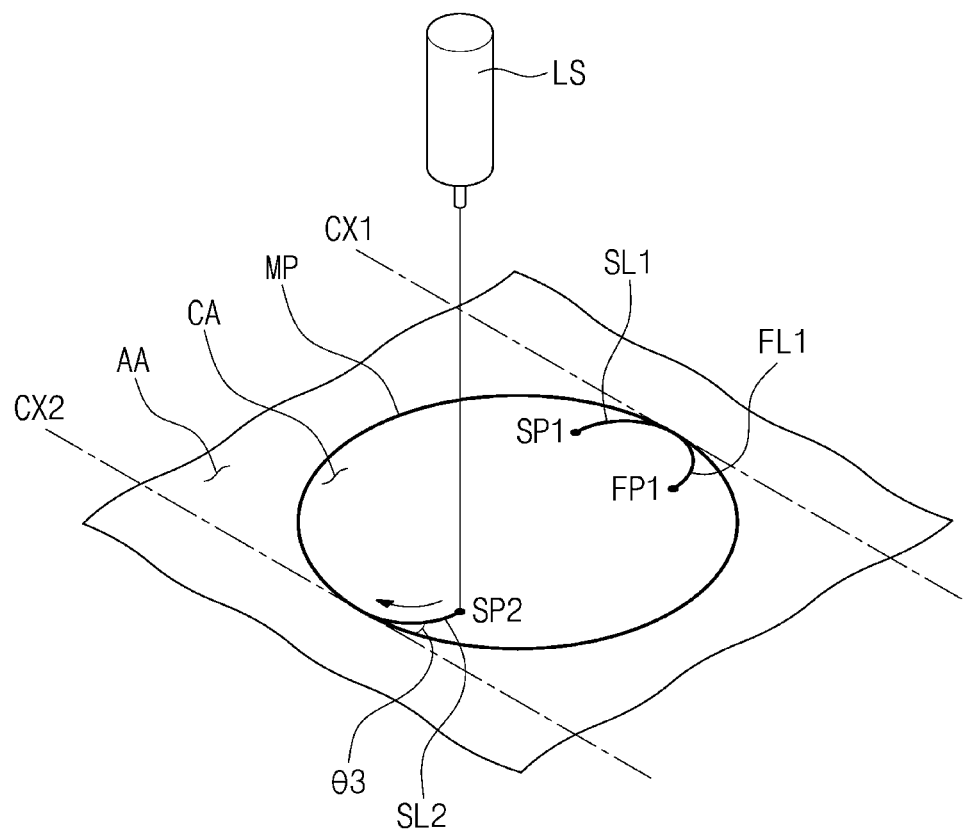

Referring to FIG. 8C, the laser unit LS may start moving from the first start cutting line SL1 to enter the moving path MP while forming the first start cutting line SL1. In this case, the laser unit LS may rotate multiple times along the moving path MP and may radiate the laser beam of a uniform intensity. For example, the laser unit LS may rotate along the moving path MP within a range equal to or greater than one time and equal to or smaller than 150 times.

The laser unit LS may move from the moving path MP to a first end point FP1 inside the hole formation area. According to the exemplary embodiments, after the laser unit LS radiated onto the moving path MP, the laser unit LS may be radiated from the moving path MP to the first end point FP1 inside the hole formation area. According to the present disclosure, the radiation of the initial laser beam ends at the first end point FP1 defined inside the hole formation area CA to uniformly maintain the intensity of the laser beam radiated onto the moving path MP. Therefore, the laser beam having the uniform intensity may be radiated onto the moving path MP.

According to the present disclosure, a first end cutting line FL1 may be formed in the hole formation area CA. The first end cutting line FL1 may be formed by removing at least a portion along a thickness direction of the work substrate EAS through a process of radiating the laser beam from the moving path MP to the first end point FP1.

The first end cutting line FL1 may have a predetermined angle θ2 with respect to a tangential line CX1 of a point at which the first end cutting line FL1 meets the moving path MP. The angle θ2 may be equal to or greater than about 10 degrees and equal to or smaller than about 90 degrees.

The first end cutting line FL1 may have a curved shape with a predetermined curvature, however, the first end cutting line FL1 should not be limited to the curved shape. That is, the first end cutting line FL1 may have a straight line.

The first end cutting line FL1 may have a length, i.e., a length from the moving path MP to the first end point FP1, which is equal to or greater than about 500 µm and equal to or smaller than about 750 µm.

Referring to FIG. 8F, the laser unit LS may move from the second start point SP2 toward the moving path MP while radiating the laser beam. When the laser unit LS is operated, an intensity of an initial laser beam in a preheating stage may be weaker than an intensity of the laser beam right before entering the moving path MP. According to the present disclosure, the radiation of the initial laser beam starts from the second start point SP2 defined inside the hole formation area CA to uniformly maintain the intensity of the laser beam radiated onto the moving path MP. Therefore, the laser beam having the uniform intensity may be radiated onto the moving path MP.

According to the present disclosure, a second start cutting line SL2 may be formed in the hole formation area CA. The second start cutting line SL2 may be formed by removing at least a portion along a thickness direction of the work substrate EAS through a process of radiating the laser beam from the second start point SP2 to the moving path MP.

The second start cutting line SL2 may have a predetermined angle θ3 with respect to a tangential line CX1 of a point at which the second start cutting line SL2 meets the moving path MP. The angle θ3 may be equal to or greater than about 10 degrees and equal to or smaller than about 90 degrees.

The second start cutting line SL2 may have a curved shape with a predetermined curvature, however, the second start cutting line SL2 should not be limited to the curved shape. That is, the second start cutting line SL2 may have a straight line.

The second start cutting line SL2 may have a length, i.e., a length from the second start point SP2 to the moving path MP, which is equal to or greater than about 500 µm and equal to or smaller than about 750 µm.

The manufacturing method of the electronic apparatus according to the present exemplary embodiment may include radiating the laser beam along the moving path.

Figure 8E:
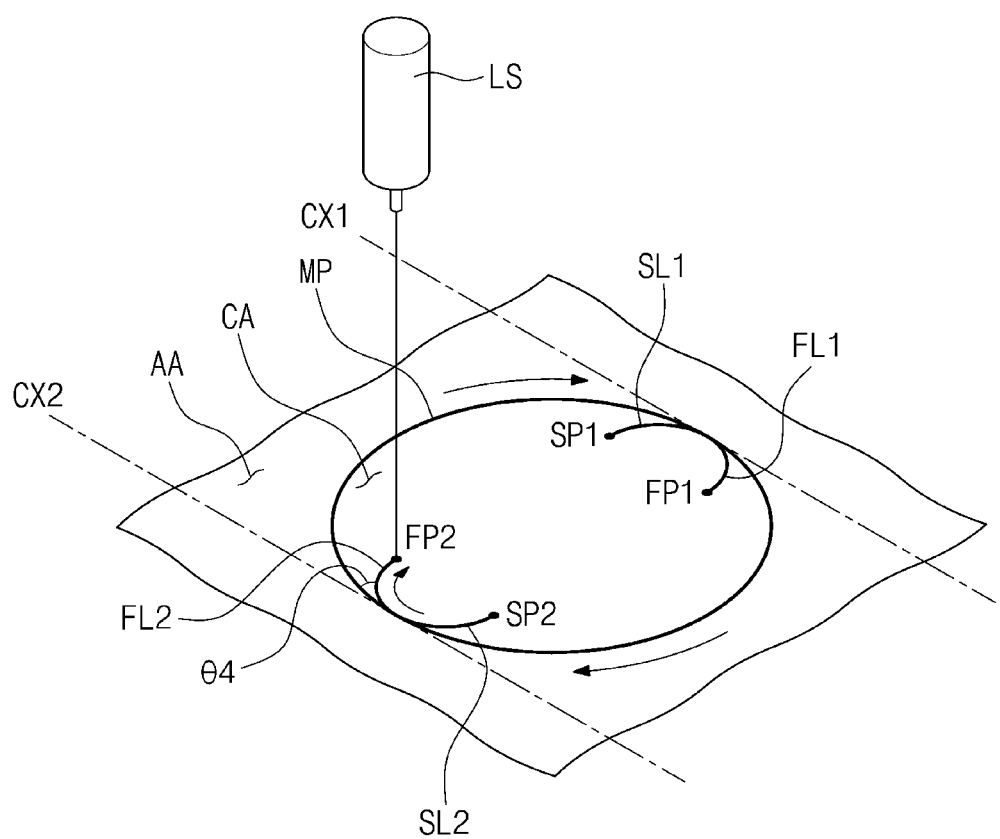

Referring to FIG. 8E, the laser unit LS may start moving from the second start cutting line SL2 to enter the moving path MP while forming the second start cutting line SL2. In this case, the laser unit LS may rotate multiple times along the moving path MP and may radiate the laser beam of a uniform intensity. For example, the laser unit LS may rotate along the moving path MP within a range equal to or greater than one time and equal to or smaller than 150 times.

The laser unit LS may move from the moving path MP to a second end point FP2 inside the hole formation area. According to the exemplary embodiments, after the laser unit LS is radiated onto the moving path MP, the laser unit LS may be radiated from the moving path MP to the second end point FP2 inside the hole formation area. According to the present disclosure, the radiation of the initial laser beam ends at the second end point FP2 defined inside the hole formation area CA to uniformly maintain the intensity of the laser beam radiated onto the moving path MP. Therefore, the laser beam having the uniform intensity may be radiated onto the moving path MP.

According to the present disclosure, a second end cutting line FL2 may be formed in the hole formation area CA. The second end cutting line FL2 may be formed by removing at least a portion along a thickness direction of the work substrate EAS through a process of radiating the laser beam from the moving path MP to the second end point FP2.

The second end cutting line FL2 may have a predetermined angle θ4 with respect to a tangential line CX1 of a point at which the second end cutting line FL2 meets the moving path MP. The angle θ4 may be equal to or greater than about 10 degrees and equal to or smaller than about 90 degrees.

The second end cutting line FL2 may have a curved shape with a predetermined curvature, however, the second end cutting line FL2 should not be limited to the curved shape. That is, the second end cutting line FL2 may have a straight line.

The second end cutting line FL2 may have a length, i.e., a length from the moving path MP to the second end point FP2, which is equal to or greater than about 500 µm and equal to or smaller than about 750 µm.

The manufacturing method of the electronic apparatus according to the present disclosure may further include forming the set module SM by forming the module hole MH in the preliminary set module SM-A and removing the protective films PF1 and PF2 attached to at least one of the upper surface S-U and the rear surface S-B of the set module SM.

According to the present disclosure, when the hole is formed by the laser beam provided from the laser unit LS, the laser beam starts moving from the point SP (first start point) defined inside the hole formation area CA. Accordingly, when the laser unit LS enters the moving path MP, the laser unit LS may radiate the laser beam of the uniform intensity while rotating along the moving path to form the hole. Thus, hole formation defects may be reduced, and the manufacturing method of the electronic apparatus may be provided with improved reliability.

Figure 9A:
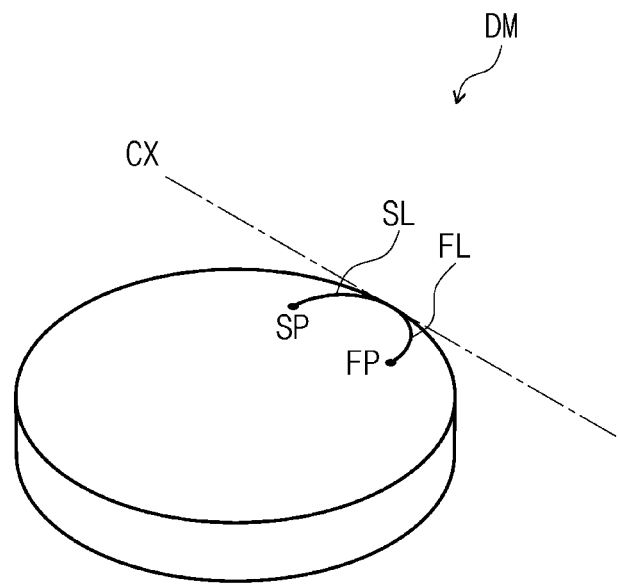
FIGS. 9A, 9B, and 9C are perspective views showing dummy parts according to exemplary embodiments of the present disclosure.
Figure 9B:
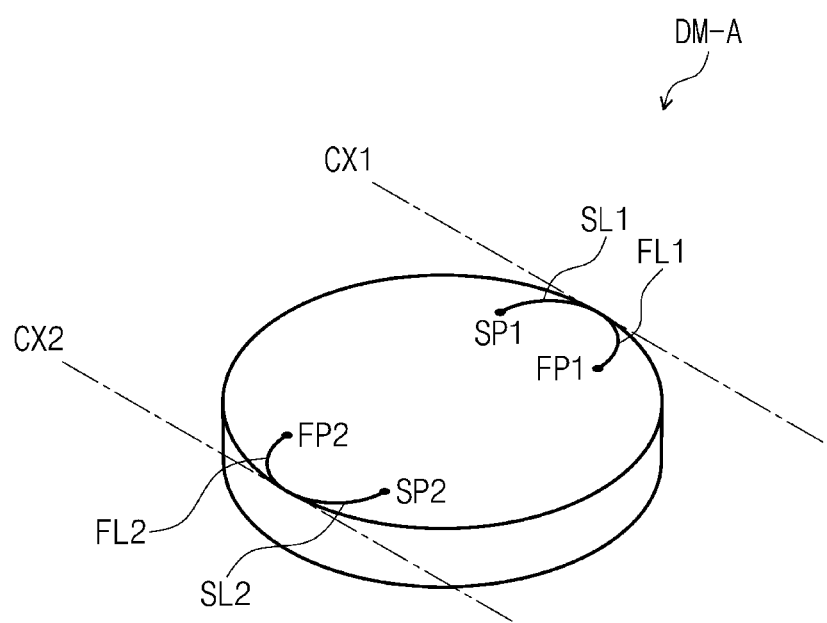
Figure 9C:
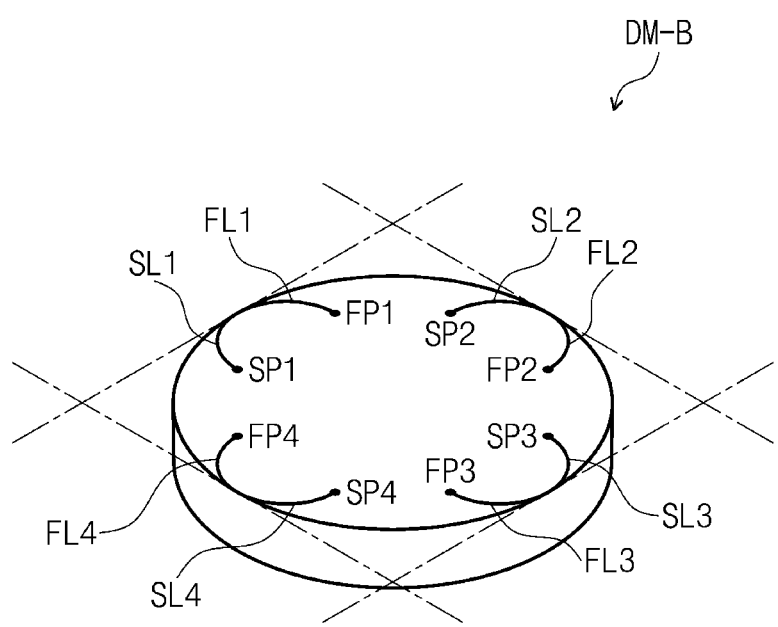

FIGS. 9A, 9B, and 9C are perspective views showing dummy parts according to exemplary embodiments of the present disclosure. In FIGS. 9A, 9B, and 9C, the same/similar reference numerals denote the same/similar elements in FIGS. 1, 2A, 2B, 3A, 3B, 4A, 4B, 5A, 5B, 6A, 6B, 6C 7, 8A, 8B, 8C, 8D, and 8E, and thus, detailed descriptions of the same/similar elements having the same/similar reference numerals will be omitted.

Dummy parts DM, DM-A, and DM-B described below may be defined as the portions of the preliminary set module SM-A that were removed to form the hole formation area CA by the manufacturing method of the electronic apparatus shown in FIGS. 4A, 4B, 5A, 5B, 6A, 6B, 6C 7, 8A, 8B, 8C, 8D, and 8E. Accordingly, components included in the dummy part DM, DM-A, and DM-B may be results formed by the radiation of the laser beam.

Referring to FIG. 9A, a manufacturing method of the electronic apparatus according to the present exemplary embodiment may further include radiating the laser beam to a direction toward a first end point defined inside the hole formation area from the moving path.

In the present exemplary embodiment, the dummy part DM may include a start point SP, an end point FP, a start cutting line SL, and an end cutting line FL.

The start point SP may be defined as a first point at which the laser beam (refer to FIG. 6A) is radiated to the hole formation area CA (refer to FIG. 6A), and the end point FP may be a point at which the laser unit LS finishes a process by leaving the moving path MP after rotating along the moving path MP (refer to FIG. 6B) multiple times. In the present exemplary embodiment, the start point SP and the end point FP may be spaced apart from each other.

According to the present disclosure, the start cutting line SL and the end cutting line FL may be formed in the dummy part DM. The start cutting line SL may be formed from the start point SP to the moving path MP by removing at least a portion of the dummy part DM in a thickness direction through a process of radiating the laser beam. In addition, the end cutting line FL may be formed from the moving path MP to the end point FP by removing at least a portion of the dummy part DM in the thickness direction through a process of radiating the laser beam.

In the present exemplary embodiment, one end of the start cutting line SL and one end of the end cutting line FL may overlap with each other on the moving path MP (refer to FIG. 6A). Therefore, the laser unit LS may start moving from a tangential line CX at which the start cutting line SL meets the moving path MP and proceed to the end point FP while forming the end cutting line FL.

The manufacturing method of the electronic apparatus may further include radiating the laser beam to a second start point defined inside a hole formation area and spaced apart from a first start point, radiating the laser beam to a direction toward a moving path from the second start point, radiating the laser along the moving path, and radiating the laser beam to a direction toward a second end point defined inside the hole formation area from the moving path.

Referring to FIG. 9B, the dummy part DM-A according to the exemplary embodiment may include two start points SP1 and SP2 spaced apart from each other and two end points FP1 and FP2 spaced apart from each other. Accordingly, the dummy part DM-A may include a first start cutting line SL1 formed from a first start point SP1 to the moving path MP (refer to FIG. 6A), a first end cutting line FL1 formed from the moving path MP to a first end point FP1, a second start cutting line SL2 formed from a second start point SP2 to the moving path MP, and a second end cutting line FL2 formed from the moving path MP to a second end point FP2.

One end of the first start cutting line SL1 may cross one end of the first end cutting line FL1 on a first tangential line CX1. In addition, one end of the second start cutting line SL2 may cross one end of the second end cutting line FL2 on a second tangential line CX2.

The laser unit LS may start its moving path MP (refer to FIG. 6A) at the first start point SP1, form the first start cutting line SL1, rotate along the moving path MP multiple times, form the second end cutting line FL2, and finish one process at the second end point FP2. Then, the laser unit LS may start its moving path MP (refer to FIG. 6A) at the second start point SP2, form the second starting cutting line SL2, rotate along the moving path MP multiple times, form the first end cutting line FL1, and finish a subsequent process after the one process at the first end point FP1.

Referring to FIG. 9C, the dummy part DM-B may include two or more start points SP1, SP2, SP3, and SP4 spaced apart from each other and two or more end points FP1, FP2, FP3, and FP4 spaced apart from each other. Accordingly, a plurality of start cutting lines SL1, SL2, SL3, and SL4 and a plurality of end cutting lines FL1, FL2, FL3, and FL4, which correspond to the start points SP1, SP2, SP3, and SP4 and the end points FP1, FP2, FP3, and FP4, may be formed in the dummy part DM-B.

The laser unit LS may perform a process while crossing the start points SP1, SP2, SP3, and SP4 and the end points FP1, FP2, FP3, and FP4.

Some of the advantages that may be achieved by exemplary implementations/embodiments of the invention and/or exemplary methods of the invention include According to the above, when the hole is formed using the laser beam, the laser beam starts moving from a point defined inside the hole formation area. Thus, once the laser beam enters the moving path, the laser beam may be radiated with uniform intensity while rotating along the moving path to form the hole. Accordingly, hole formation defects may be reduced, and the manufacturing method of the electronic apparatus may be provided with improved reliability.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A method of manufacturing an electronic apparatus, comprising:
   providing a work substrate, the work substrate comprising:
      a preliminary set module comprising: an active area, the active area comprising a hole formation area; and a non-active area defined adjacent to the active area; and
      a protective film covering at least one of an upper surface and a rear surface of the preliminary set module;
   radiating a laser beam to a first start point defined inside the hole formation area;

radiating the laser beam to the work substrate from the first start point toward a moving path to form a first start cutting line in the hole formation area by removing at least a portion of the work substrate between the first start point and the moving path, the moving path of the laser beam defined as a boundary between the hole formation area and the active area;

radiating the laser beam along the moving path; and removing the hole formation area from the preliminary set module to form a set module in which a module hole is defined;

radiating the laser beam from the moving path toward a first end point defined inside the hole formation area, wherein the first start cutting line forms a predetermined angle with respect to a tangential line of a point at which the first start cutting line meets the moving path.

2. The method of claim 1, further comprising: forming a first end cutting line from the moving path to the first end point inside the hole formation area by removing at least a portion of the work substrate using the laser beam, wherein one end of the first start cutting line and one end of the first end cutting line overlap with each other on the moving path.

3. The method of claim 2, wherein the other end of the first start cutting line and the other end of the first end cutting line are spaced apart from each other inside the hole formation area.

4. The method of claim 1, wherein the first start cutting line has a length equal to or greater than about 500 μm and equal to or smaller than about 750 μm.

5. The method of claim 1, wherein the laser beam rotates along the moving path multiple times in the radiating of the laser beam along the moving path.

6. The method of claim 1, wherein the angle is equal to or greater than about 10 degrees and equal to or smaller than about 90 degrees.

7. The method of claim 1, further comprising:
radiating the laser beam to a second start point defined inside the hole formation area and spaced apart from the first start point;
radiating the laser beam to a direction toward the moving path from the second start point;
radiating the laser beam along the moving path; and
radiating the laser beam to a direction toward a second end point defined inside the hole formation area from the moving path.

8. The method of claim 1, further comprising removing the protective film from the set module.

9. The method of claim 1, wherein the laser beam comprises at least one of a picosecond laser beam and a femtosecond laser beam.

10. A method of manufacturing an electronic apparatus, comprising:
providing a work substrate comprising:
a preliminary set module comprising: an active area, the active area comprising a hole formation area; and a non-active area defined adjacent to the active area; and
a protective film covering at least one of an upper surface and a rear surface of the preliminary set module;
radiating a laser beam to a first start point defined inside the hole formation area;
forming a first start cutting line inside the hole formation area, comprising:
removing at least a portion of the work substrate from the first start point to a moving path by radiating the laser beam to a direction toward the moving path from the first start point, the moving path of the laser beam defined as a boundary between the hole formation area and the active area;
radiating the laser beam along the moving path;
forming a first end cutting line inside the hole formation area, comprising:
removing at least a portion of the work substrate from the moving path to a first end point defined inside the hole formation area by radiating the laser beam to a direction from the moving path toward the first end point; and
removing the hole formation area from the preliminary set module to form a set module in which a module hole is defined,
wherein one end of the first start cutting line and one end of the first end cutting line overlap with each other on the moving path.

11. The method of claim 10, wherein the first start cutting line forms a predetermined angle with respect to a tangential line of a point at which the first start cutting line meets the moving path.

12. The method of claim 11, wherein the angle is equal to or greater than about 10 degrees and equal to or smaller than about 90 degrees.

13. The method of claim 10, wherein the other end of the first start cutting line and the other end of the first end cutting line are spaced apart from each other inside the hole formation area.

14. The method of claim 10, wherein at least one of the first start cutting line and the first end cutting line is a curved line.

15. The method of claim 10, wherein the first start cutting line has a length equal to or greater than about 500 μm and equal to or smaller than about 750 μm.

16. The method of claim 10, wherein the laser beam rotates along the moving path multiple times in the radiating of the laser beam along the moving path.

17. The method of claim 10, further comprising:
radiating the laser beam to a second start point defined inside the hole formation area and spaced apart from the first start point;
radiating the laser beam to a direction toward the moving path from the second start point;
radiating the laser beam along the moving path; and
radiating the laser beam to a direction toward a second end point defined inside the hole formation area from the moving path.

18. The method of claim 10, further comprising removing the protective film from the set module.

19. The method of claim 10, wherein the laser beam comprises at least one of a picosecond laser beam and a femtosecond laser beam.

20. A method of manufacturing an electronic apparatus, comprising:
providing a work substrate, the work substrate comprising:
a preliminary set module comprising: an active area, the active area comprising a hole formation area; and a non-active area defined adjacent to the active area; and
a protective film covering at least one of an upper surface and a rear surface of the preliminary set module;
radiating a laser beam to a first start point defined inside the hole formation area;

radiating the laser beam to the work substrate from the first start point toward a moving path to form a first start cutting line in the hole formation area by removing at least a portion of the work substrate between the first start point and the moving path, the moving path of the laser beam defined as a boundary between the hole formation area and the active area;

radiating the laser beam along the moving path; and removing the hole formation area from the preliminary set module to form a set module in which a module hole is defined, wherein the first start cutting line forms a predetermined angle with respect to a tangential line of a point at which the first start cutting line meets the moving path, and wherein the laser beam rotates along the moving path multiple times in the radiating of the laser beam along the moving path.

\* \* \* \* \*